(12) United States Patent
Chen et al.

(10) Patent No.: US 10,049,965 B2
(45) Date of Patent: Aug. 14, 2018

(54) THROUGH-SUBSTRATE VIAS AND METHODS FOR FORMING THE SAME

(71) Applicant: Taiwan Semiconductor Manufacturing Company, Ltd., Hsin-Chu (TW)

(72) Inventors: Ming-Fa Chen, Taichung (TW); Yu-Young Wang, New Taipei (TW); Sen-Bor Jan, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 14/325,727

(22) Filed: Jul. 8, 2014

(65) Prior Publication Data

US 2014/0319587 A1 Oct. 30, 2014

Related U.S. Application Data

(62) Division of application No. 13/457,823, filed on Apr. 27, 2012, now Pat. No. 8,803,292.

(51) Int. Cl.
*H01L 23/48* (2006.01)
*H01L 29/78* (2006.01)
(Continued)

(52) U.S. Cl.
CPC ...... *H01L 23/481* (2013.01); *H01L 21/76816* (2013.01); *H01L 21/76898* (2013.01);
(Continued)

(58) Field of Classification Search
CPC ......... H01L 21/76816; H01L 21/76898; H01L 23/481; H01L 23/485; H01L 24/13;
(Continued)

(56) References Cited

U.S. PATENT DOCUMENTS 6,201,278 B1 * 3/2001 Gardner ............ H01L 29/66621
257/330
6,376,351 B1 * 4/2002 Tsai .................. H01L 21/82344
257/E21.622

(Continued)

FOREIGN PATENT DOCUMENTS

TW I270174 1/2007
TW I416702 11/2013

*Primary Examiner* — Cheung Lee
*Assistant Examiner* — Stephen C Smith
(74) *Attorney, Agent, or Firm* — Slater Matsil, LLP

(57) ABSTRACT

A device includes a semiconductor substrate and a Metal-Oxide-Semiconductor (MOS) transistor. The MOS transistor includes a gate electrode over the semiconductor substrate, and a source/drain region on a side of the gate electrode. A source/drain contact plug includes a lower portion and an upper portion over the lower portion, wherein the source/drain contact plug is disposed over and electrically connected to the source/drain region. A gate contact plug is disposed over and electrically connected to the gate electrode, wherein a top surface of the gate contact plug is level with a top surface of the top portion of the source/drain contact plug. A Through-Substrate Via (TSV) extends into the semiconductor substrate. A top surface of the TSV is substantially level with an interface between the gate contact plug and the gate electrode.

20 Claims, 14 Drawing Sheets

(51) Int. Cl.
*H01L 23/485* (2006.01)
*H01L 21/768* (2006.01)
*H01L 23/00* (2006.01)

(52) U.S. Cl.
CPC ............ *H01L 23/485* (2013.01); *H01L 24/13* (2013.01); *H01L 29/78* (2013.01); *H01L 2224/02372* (2013.01); *H01L 2224/0401* (2013.01); *H01L 2224/13024* (2013.01); *H01L 2224/13025* (2013.01); *H01L 2924/13091* (2013.01)

(58) Field of Classification Search
CPC ........... H01L 29/78; H01L 2224/02372; H01L 2224/0401; H01L 2224/13024; H01L 2224/13025; H01L 2924/13091
See application file for complete search history.

(56) References Cited

U.S. PATENT DOCUMENTS

| | | |
|---|---|---|
| 7,041,576 B2 | 5/2006 | Pozder et al. |
| 7,495,335 B2 | 2/2009 | Kuo |
| 7,799,678 B2 | 9/2010 | Kropewnicki et al. |
| 7,868,425 B2 | 1/2011 | Kondo et al. |
| 7,960,282 B2* | 6/2011 | Yelehanka ........ H01L 21/76898 257/E23.145 |
| 8,236,688 B2 | 8/2012 | Yelehanka et al. |
| 8,264,065 B2 | 9/2012 | Su et al. |
| 8,624,324 B1 | 1/2014 | Chen et al. |
| 2005/0173738 A1 | 8/2005 | Kondo et al. |
| 2005/0239241 A1 | 10/2005 | Ouyang et al. |
| 2009/0108363 A1 | 4/2009 | Forbes et al. |
| 2009/0315154 A1* | 12/2009 | Kirby .................... H01L 21/743 257/621 |
| 2010/0130002 A1 | 5/2010 | Dao et al. |
| 2010/0224876 A1 | 9/2010 | Zhu |
| 2010/0283130 A1* | 11/2010 | Nishio ............. H01L 21/76898 257/621 |
| 2010/0297844 A1* | 11/2010 | Yelehanka ........ H01L 21/76898 438/667 |
| 2011/0018032 A1 | 1/2011 | Kondo et al. |
| 2011/0084314 A1* | 4/2011 | Or-Bach ................ G03F 9/7076 257/209 |
| 2011/0254165 A1* | 10/2011 | Muranaka ........ H01L 21/76832 257/751 |
| 2011/0318923 A1 | 12/2011 | Park et al. |
| 2012/0007154 A1 | 1/2012 | Lin |
| 2012/0043666 A1 | 2/2012 | Park et al. |
| 2012/0061827 A1 | 3/2012 | Fujita |
| 2012/0074570 A1 | 3/2012 | Kolb et al. |
| 2012/0205806 A1 | 8/2012 | Yelehanka et al. |
| 2012/0292757 A1 | 11/2012 | Mauder |
| 2012/0326320 A1 | 12/2012 | Hong |
| 2013/0017642 A1 | 1/2013 | Milgrew et al. |
| 2013/0119543 A1 | 5/2013 | Yu et al. |
| 2013/0153992 A1 | 6/2013 | Loechelt |

\* cited by examiner ated circuits on a die to the backside of the die. In addition, the TSVs are also used to provide a short grounding path to connect the ground in the integrated circuits to the backside of the die, which is typically covered by a grounded aluminum film.

THROUGH-SUBSTRATE VIAS AND METHODS FOR FORMING THE SAME

PRIORITY CLAIM AND CROSS-REFERENCE

This application is a divisional of U.S. patent application Ser. No. 13/457,823, entitled "Through-Substrate Vias and Methods for Forming the Same," filed on Apr. 27, 2012, which application is incorporated herein by reference.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-silicon vias (TSVs, or sometimes referred to as through-substrate vias) are often used in 3DICs and stacked dies for interconnecting dies. In this case, the TSVs are used to connect the integrated circuits on a die to the backside of the die. In addition, the TSVs are also used to provide a short grounding path to connect the ground in the integrated circuits to the backside of the die, which is typically covered by a grounded aluminum film.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Through-Substrate Via (TSV) and the method of forming the same are provided in accordance with various exemplary embodiments. The intermediate stages of forming the TSV are illustrated. The variations of the embodiments are discussed. Throughout the various views and illustrative embodiments, like reference numbers are used to designate like elements.

Figure 1:
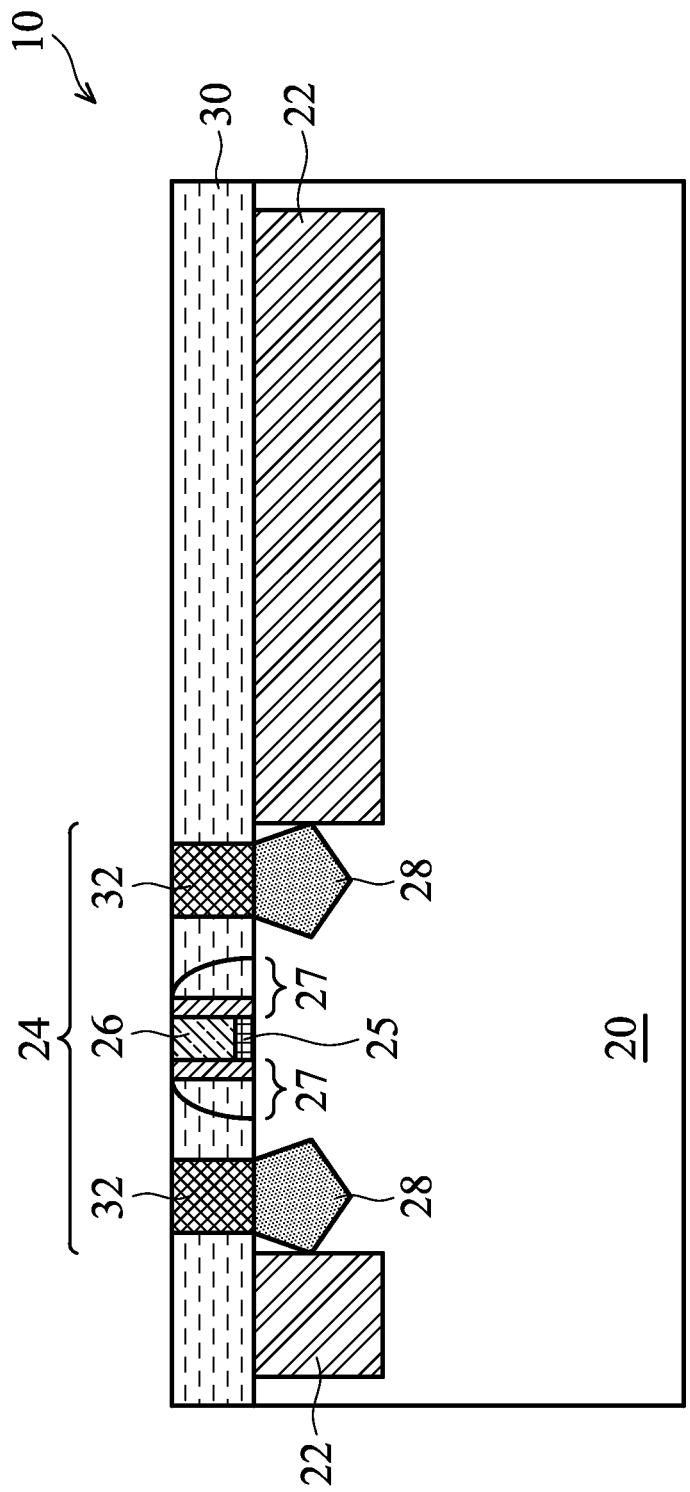
FIGS. 1 through 9 are cross-sectional views of intermediate stages in the manufacturing of a Through-Substrate Via (TSV) in accordance with some exemplary embodiments.

Referring to FIG. 1, wafer 10 is provided. Wafer 10 includes substrate 20, which may comprise silicon, silicon germanium, silicon carbon, gallium arsenide, III-V compound semiconductor materials, or the like. Substrate 20 may be a bulk substrate or a Semiconductor-On-Insulator (SOI) substrate. Insulation regions 22, which may be Shallow Trench Isolation (STI) regions, are formed in substrate 20.

Metal-Oxide-Semiconductor (MOS) device (transistor) 24 is formed at a top surface of substrate 20. MOS device 24 includes gate dielectric 25, gate electrode 26, and gate spacers 27 on the sidewalls of gate dielectric 25 and gate electrode 26. Source and drain regions 28 (referred to as source/drain regions hereinafter) may be portions of substrate 20 that are doped with a p-type or an n-typed impurity, depending on the conductivity type of the respective MOS device 24. Source/drain regions 28 may also comprise stressors for applying stresses to the channel region of MOS device 24, wherein the stressors may be silicon germanium stressors or silicon carbon stressors. Although not shown, source/drain silicides may be formed as the top portions of source/drain regions 28, and/or the top portion of gate electrode 26. Gate electrode 26 may be a metal gate that is formed of metal or metal alloy(s), although gate electrode 26 may also be formed of polysilicon, metal silicides, or the like. Gate electrode 26 is formed in Inter-Layer Dielectric (ILD, referred to as ILD0 hereinafter) 30, wherein ILD0 30 may be formed of an oxide such as Phospho-Silicate glass (PSG), Boro-Silicate Glass (BSG), Boron-Doped Phospho-Silicate Glass (BPSG), Tetraethyl Orthosilicate (TEOS) oxide, or the like. In some embodiments, gate electrode 26 is formed using a gate-last approach, although the gate-first approach may be adopted. The top surface of gate electrode 26 may be level with the top surface of ILD0 30.

Contact plugs 32, which are sometimes referred to as M0_OD1 or MD1, are formed in ILD0 30, and are overlapping and electrically coupled to source/drain regions 28. In some embodiments, the top surfaces of MD1s 32, the top surface of gate electrode 26, and/or the top surface of ILD0 30 are level with each other.

Figure 2:
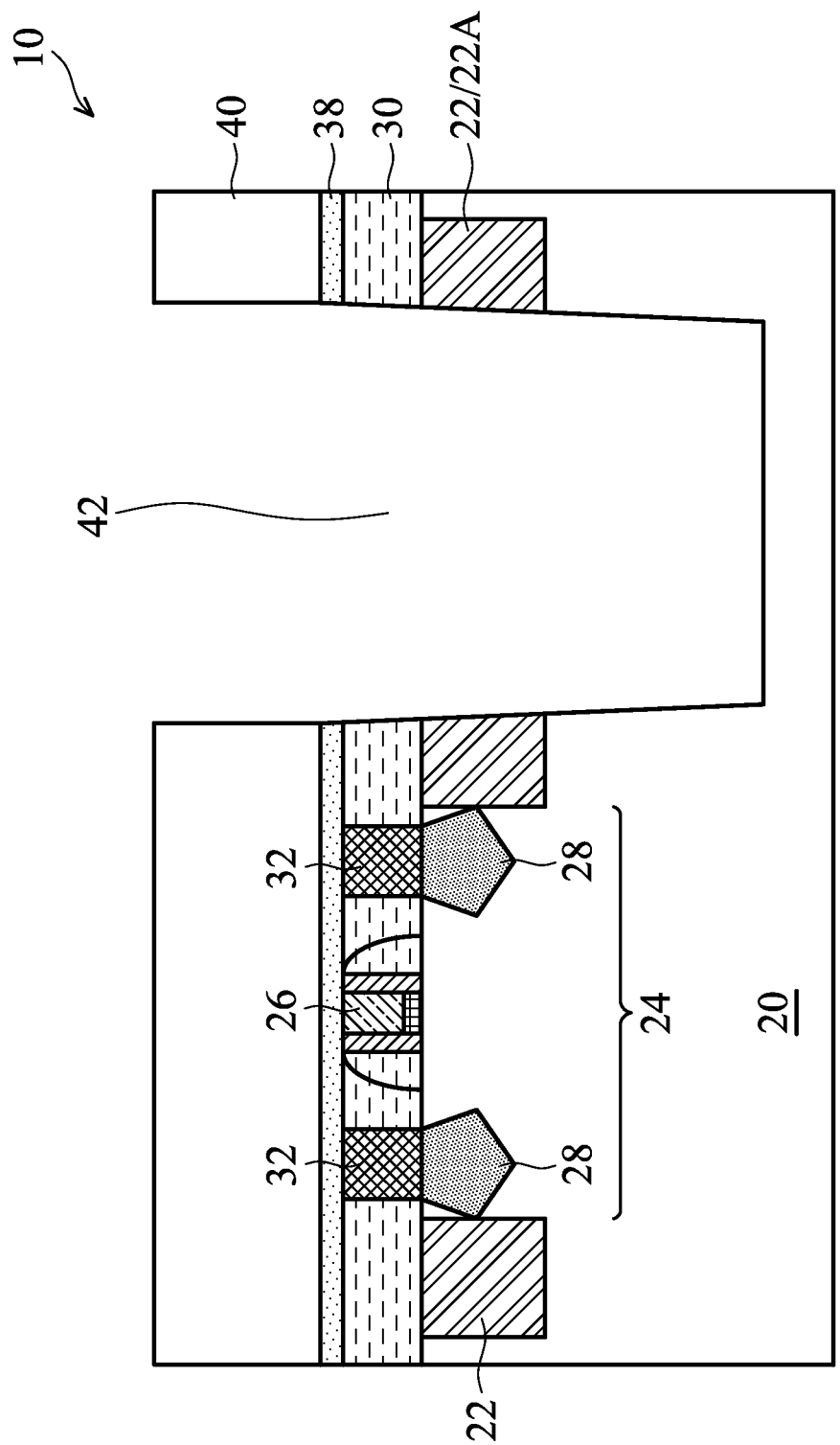

Referring to FIG. 2, Chemical Mechanical Polish (CMP) stop layer 38 is formed over ILD0 30, gate electrode 26, and MD1s 32. CMP stop layer 38 may comprise silicon nitride, silicon oxycarbide, or the like. Next, photo resist 40 is formed over CMP stop layer 38, and is then patterned. MOS device 24 is protected by the remaining portion of photo resist 40. A patterning is then performed to etch CMP stop layer 38, ILD0 30, and substrate 20 to form TSV opening 42. In some embodiments, TSV opening 42 extends into a center portion of one of STI regions 22 (marked as 22A), so that the remaining portion of STI region 22 encircles TSV opening 42. During the etching, STI regions 22A may be used as an etch stop layer. Alternatively, TSV opening 42 does not penetrate through any of STI regions 22. TSV opening 42 stops at an intermediate level between the top surface and the bottom surface of substrate 20.

Figure 3:
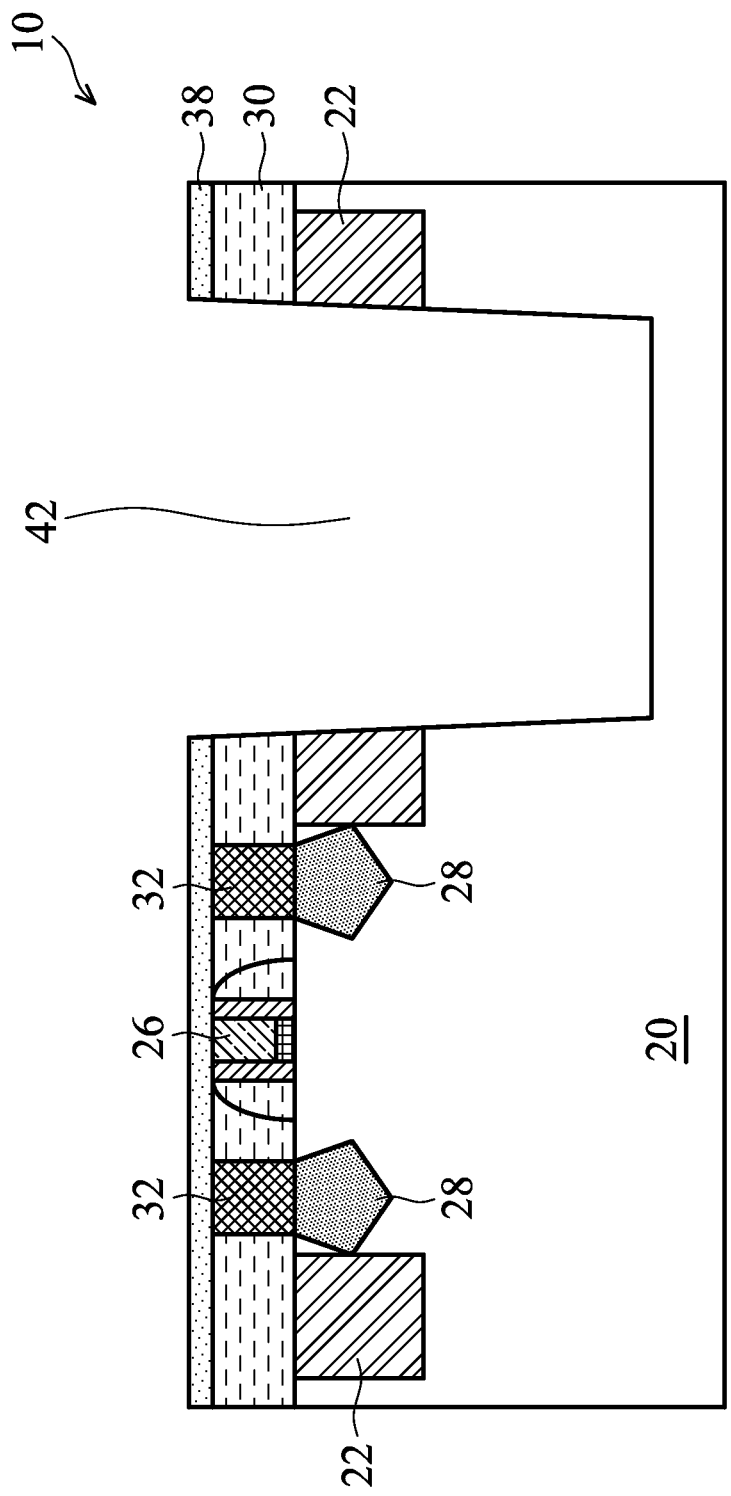
Figure 4:
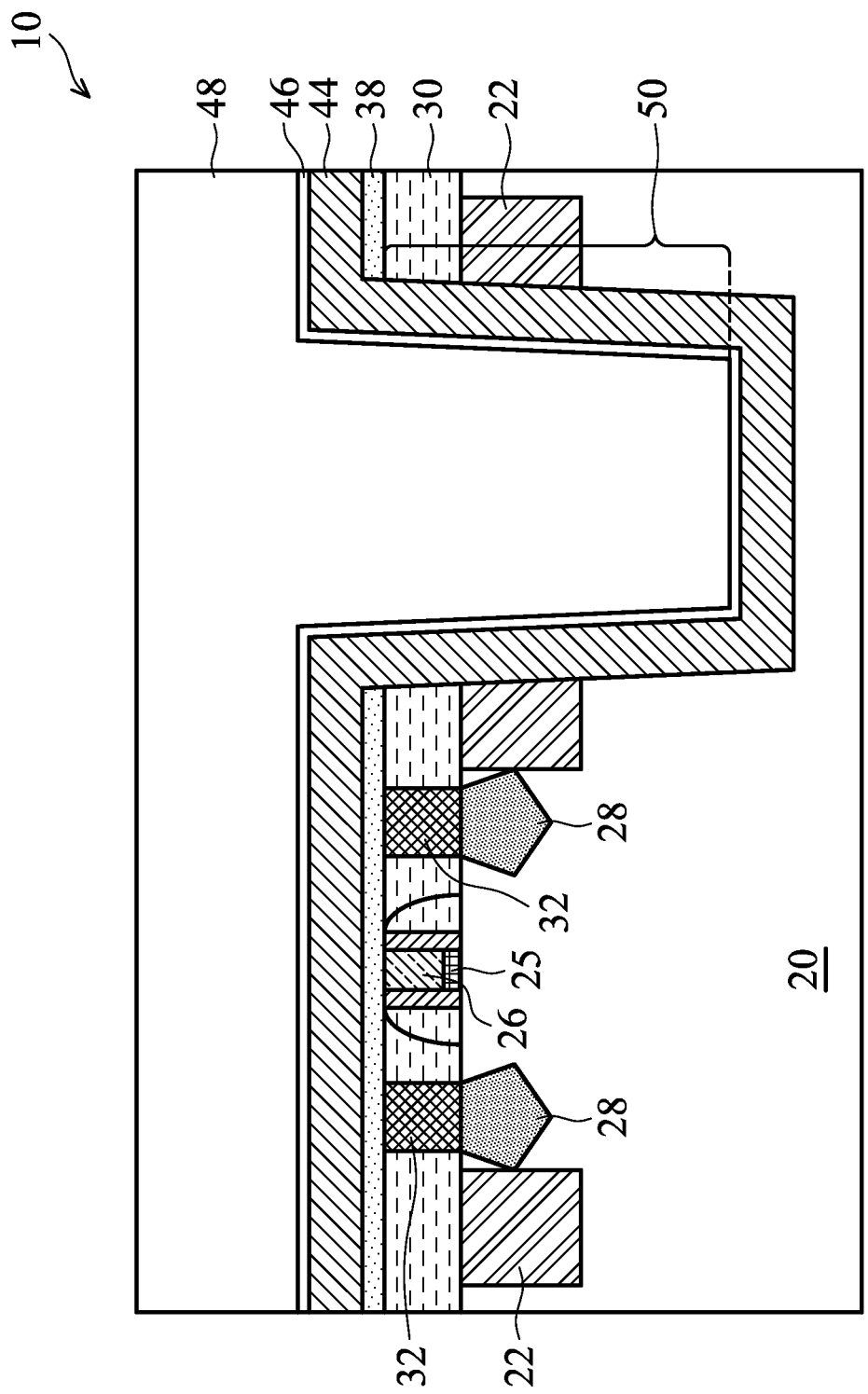

Referring to FIG. 3, photo resist 40 is removed, for example, through an ashing step. Next, as shown in FIG. 4, insulation layer 44 is formed on the top surface of CMP stop layer 38, and extends into TSV opening 42. Insulation layer 44 may be a substantially conformal layer, wherein the horizontal portions and the vertical portions of insulation layer 44 have substantially the same thickness. Insulation layer 44 may comprise silicon oxide, silicon nitride, silicon carbide, silicon oxynitride, combinations thereof, or multi-layer thereof. Next, diffusion barrier layer 46, which also act as a glue layer, is blanket formed to cover the sidewalls and the bottom of TSV opening 42. Diffusion barrier layer 46 may include titanium, titanium nitride, tantalum, tantalum nitride, and combinations thereof, and can be formed using Physical Vapor Deposition (PVD), for example. Next, a thin seed layer (not shown) may be blanket formed on diffusion barrier layer 46. The seed layer may include copper or copper alloys, and metals such as tungsten, silver, gold, aluminum, and combinations thereof may also be included. In some embodiments, the seed layer is formed through PVD. In other embodiments, other methods such as electro plating or electro-less plating may be used.

Metallic material 48 is then filled into TSV opening 42. TSV 50 is thus formed in TSV opening 42. In various embodiments, metallic material 48 includes copper or a copper alloy, although other metals, such as aluminum, silver, gold, and combinations thereof, may also be used. The formation methods may include electro plating, for example. Metallic material 48 is filled until the top surface of metallic material 48 is higher than the top surface of CMP stop layer 38.

Figure 5:
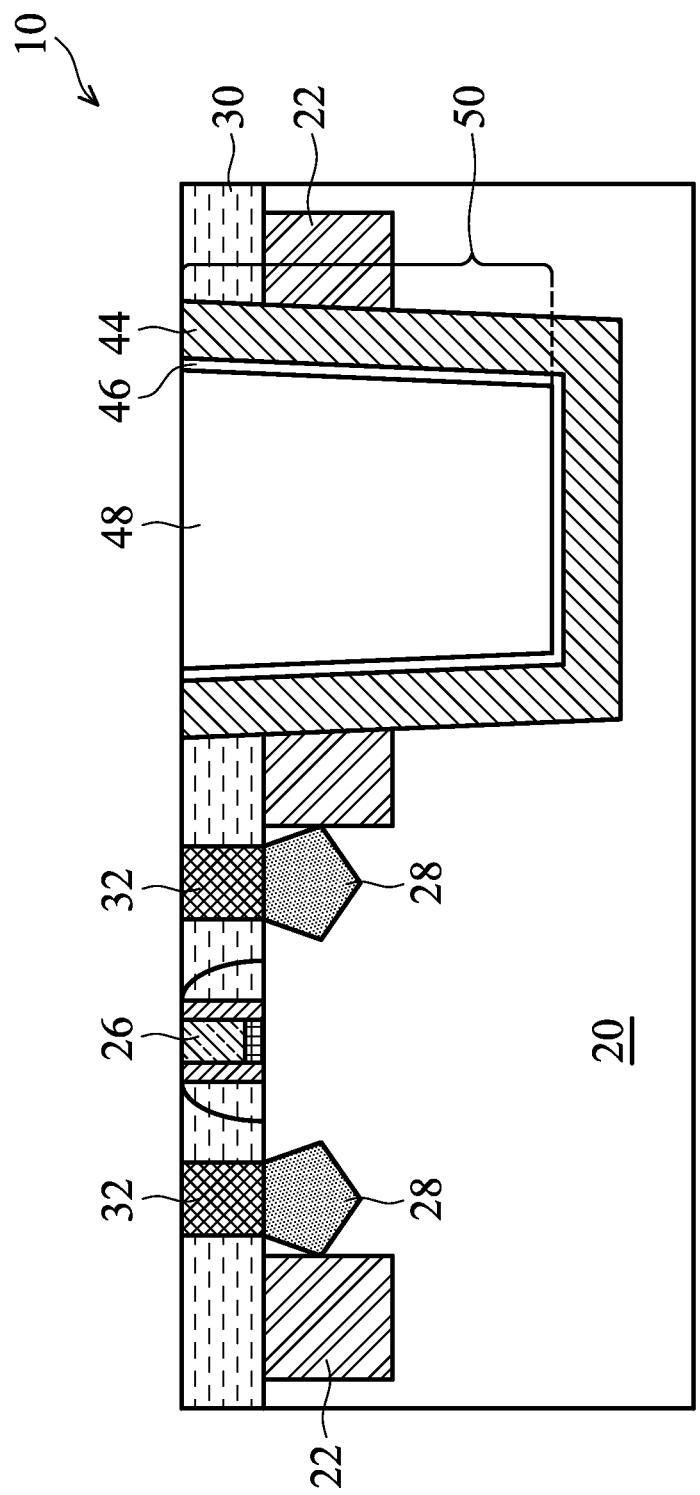

FIG. 5 illustrates the CMP step for removing excess metallic material 48. In some embodiment, the CMP is performed using a slurry that does not attack CMP stop layer 38 substantially, and hence the CMP stops on CMP stop layer 38. A further CMP is then performed, for example, using a slurry that attacks CMP stop layer 38. Accordingly, in some embodiments, the top surfaces of MD1$s$ 32 and gate electrode 26 are exposed. In the resulting structure, the top surface of TSV 50 is level with the top surfaces of MD1 32, the top surface of ILD0 30, and possibly level with the top surface of gate electrode 26.

Figure 6:
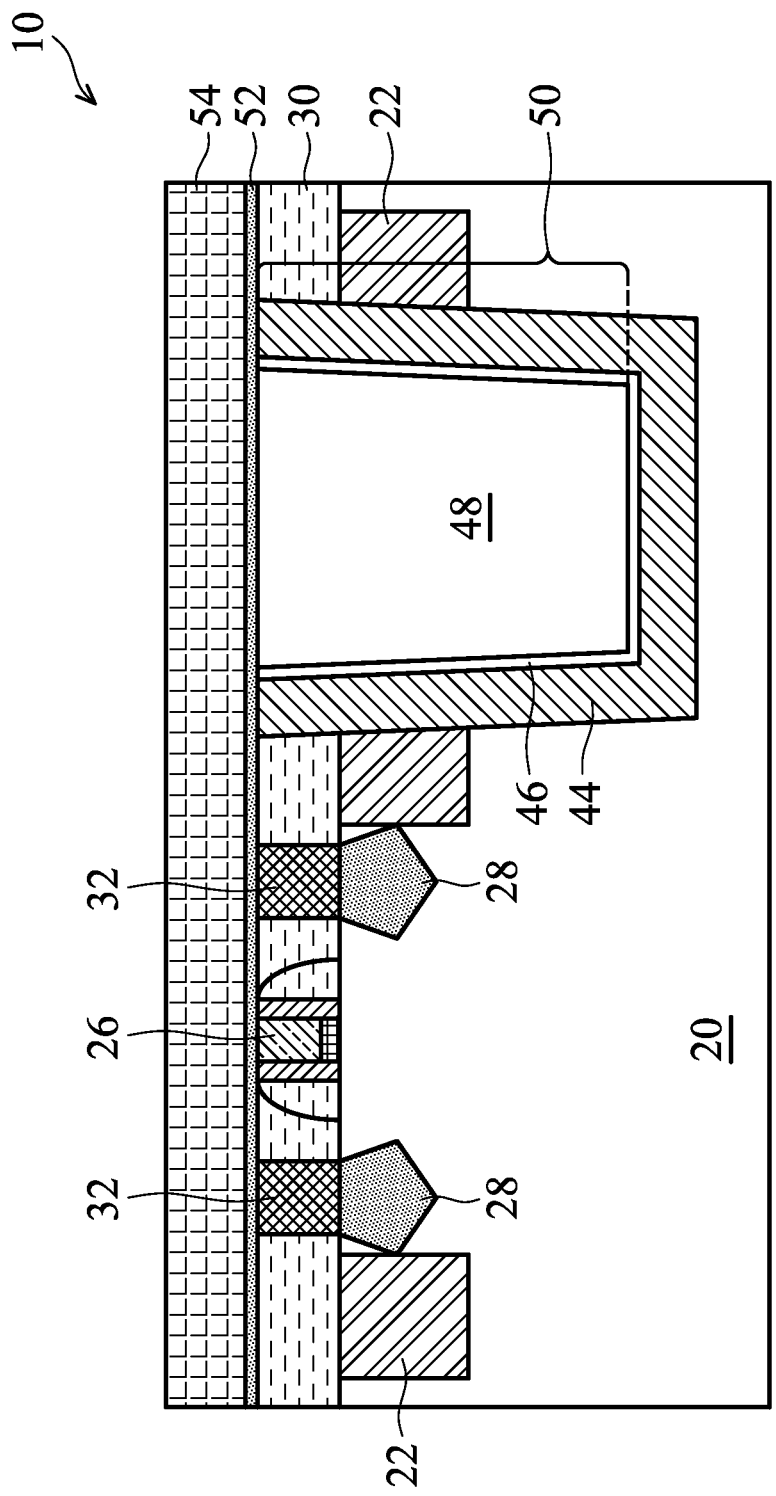

Referring to FIG. 6, Contact Etch Stop Layer (CESL) 52 and ILD1 54 are formed. In some embodiments, CESL 52 is formed of silicon nitride or other dielectric materials. ILD1 54 may comprise silicon oxycarbide, TEOS oxide, and/or the like.

Figure 7:
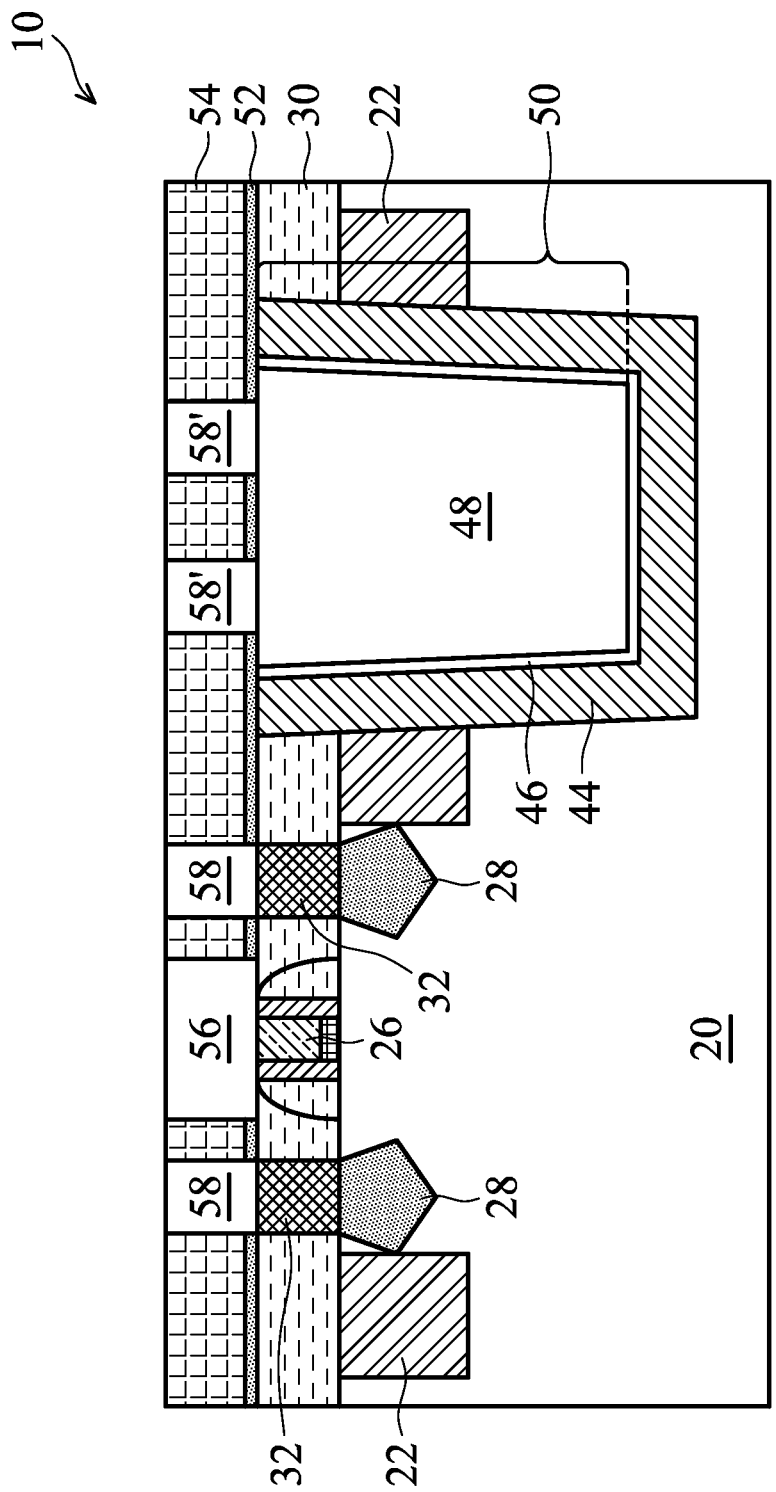

Next, FIG. 7 illustrates the formation of gate contact plug 56, source/drain contact plugs 58 (sometimes referred to as M0_OD2 or MD2 since they overlap and are connected to MD1$s$ 32). Gate contact plug 56 is alternatively referred to as M0_poly 56 since it overlaps and is connected to gate electrode 26, which sometimes comprises polysilicon. Furthermore, TSV contact plugs 58' are formed to overlap and connect to TSV 50, and are used as the electrical connection to TSV 50. Contact plugs 56, 58, and 58' are formed in ILD1 54, wherein contact plug 56 are electrically coupled to, and may be in physical contact with, gate electrode 26. Source/drain contact plugs 58 are electrically coupled to, and may be in physical contact with, M0_OD1 32. TSV contact plugs 58' may penetrate through CESL 52 to contact TSV 50. The formation process of contact plugs 56, 58, and 58' may include forming openings in ILD1 54 and CESL 52, filling the openings with an adhesion/barrier layer and a metallic material such as tungsten or copper, and performing a CMP.

It is observed that each of MD1$s$ 32 and the respective overlying MD2$s$ 58 in combination form a source/drain contact plug. Since MD1$s$ 32 and MD2$s$ 58 are formed in different process steps, there are visible interfaces between MD1$s$ 32 and MD2$s$ 58. Furthermore, the edges of MD1$s$ 32 and MD2$s$ 58 may not be continuous and smooth.

Figure 8:
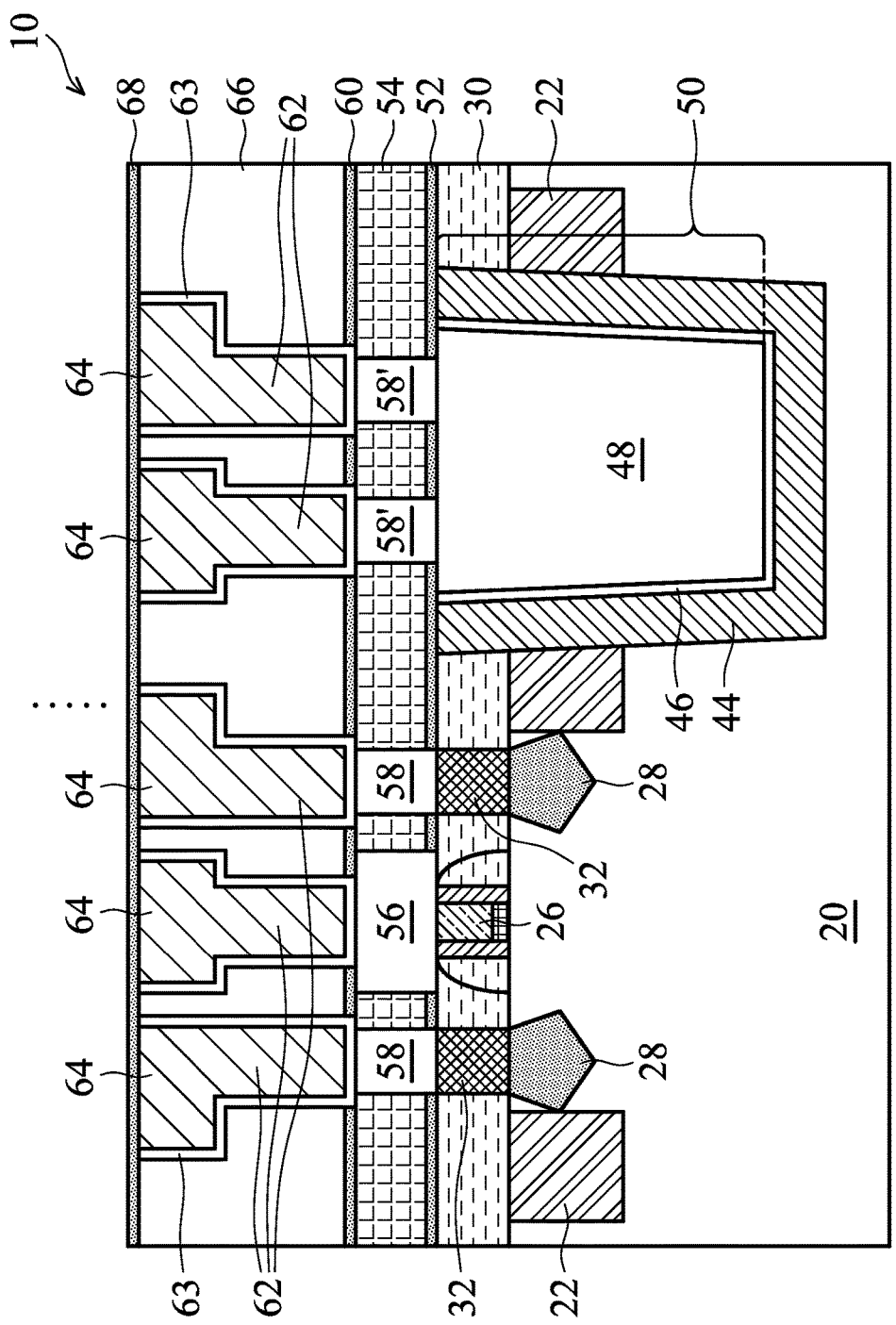

In subsequent process, as shown in FIG. 8, etch stop layer 60, M0 vias 62, and metal lines 64 are formed. Metal lines 64 are collectively referred to as bottom metal layer M1. M0 vias 62 and metal lines 64 are formed in dielectric layer 66, wherein dielectric layer 66 may be formed of a low-k dielectric material having a k value smaller than about 3.0, or smaller than about 2.5, for example. Dielectric layer 66 is alternatively referred to as an Inter Metal Dielectric (IMD) layer, or IMD 1.

In some embodiments, M0 vias 62 and metal lines 64 are formed as a dual-damascene structure, and hence there is no noticeable interface formed between M0 vias 62 and the respective overlying metal lines 64. The dual-damascene structure may include diffusion barrier layer 63 (such as Ti/TiN/Ta/TaN) and a copper-containing material over the diffusion barrier layer. When M0 vias 62 and metal lines 64 form dual damascene structures, the diffusion barrier is not inserted between M0 vias 62 and the overlying metal lines 64. In alternative embodiments, M0 vias 62 may be formed using a single-damascene process, and metal lines 64 may also be formed using a single-damascene process. In yet other embodiments, M0 vias 62 are not formed, while metal lines 64 are in contact with contact plugs 56 and 58. In subsequent process, more metal layers (not shown) may be formed over metal lines 64. Etch stop layer 68 may then be formed, and further metal lines and vias (not shown, represented by dots) may be formed in more dielectric layers to electrically couple to TSV 50 and contact plugs 56 and 58.

Figure 9:
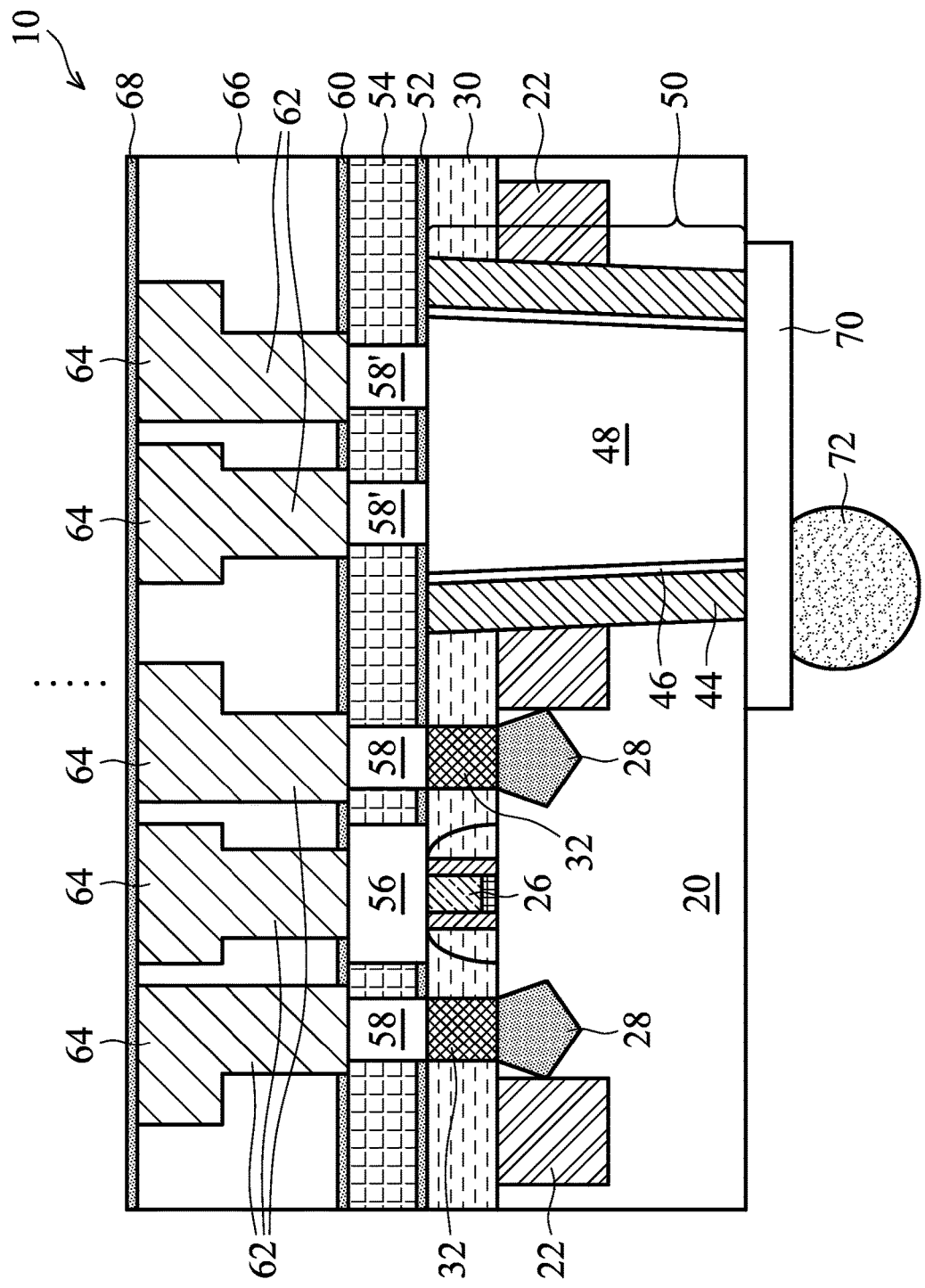

FIG. 9 illustrates the formation of the backside structure that is connected to TSV 50. In some exemplary formation process, substrate 20 is grinded from the backside (the side facing down in FIGS. 8 and 9), until TSV 50 is exposed. Redistribution line/pad 70 is then formed to electrically couple to TSV 50. Electrical connector 72 may be formed on redistribution line/pad 70. Electrical connector 72 may be a solder ball, a copper pillar, or a composite connector including a copper pillar and a solder cap.

FIGS. 10 through 13 illustrate the formation of TSV 50 in accordance with alternative embodiments. Unless specified otherwise, the materials and formation methods of the components in these embodiments are essentially the same as the like components, which are denoted by like reference numerals in the embodiments shown in FIGS. 1 through 9. The details of the like components shown in FIGS. 10 through 13 may thus be found in the discussion of the embodiments shown in FIGS. 1 through 9.

Figure 10:
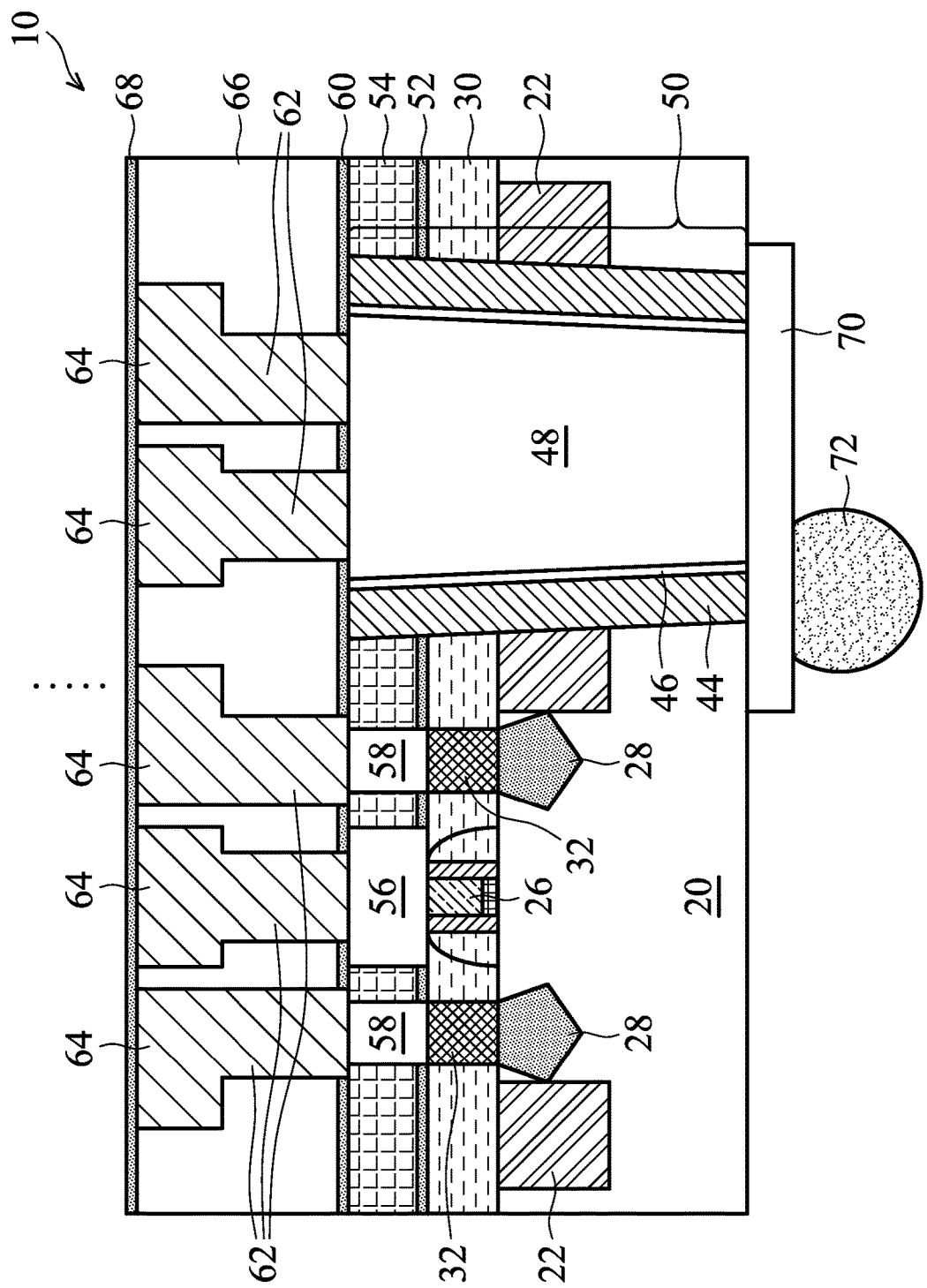
FIG. 10 illustrates a cross-sectional view of a TSV and a MOS device in accordance with some alternative exemplary embodiments.
Figure 11:
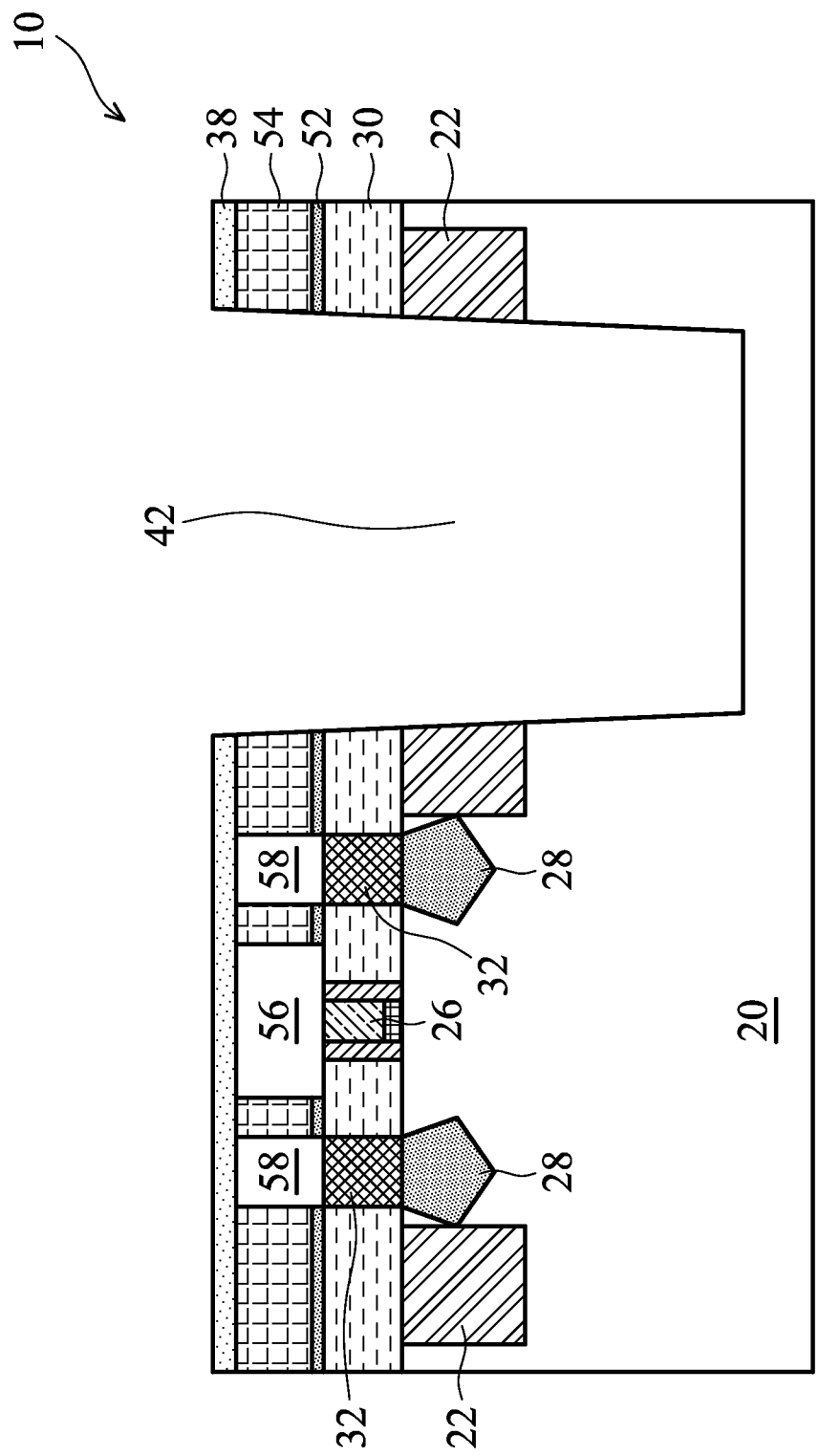
FIG. 11 illustrates an intermediate stage in the formation of the structure shown in FIG. 10.

Referring to FIG. 10, the top surface of TSV 50 is level with M0_poly 56 and MD2$s$ 58. The formation process is similar to the process for forming TSV 50 in FIG. 8, except the formation of TSV 50 is started after M0_poly 56 and MD2$s$ 58 are formed, and before etch stop layer 60 is formed. For example, FIG. 11 illustrates a cross-sectional view of an intermediate stage in the formation of TSV 50. In these exemplary embodiments, after the formation of ILD1 54 and M0_poly 56 and MD2$s$ 58, CMP stop layer 38 is formed, and TSV opening 42 is then formed. Next, an insulation layer, a diffusion barrier layer, and a seed layer (not shown) are formed. A metallic material is then formed to fill the rest of TSV opening 42. The process steps and the materials for forming the insulation layer, the diffusion barrier layer, the seed layer, and the metallic material may be found referring to the embodiments shown in FIG. 4. A CMP is then performed, and hence the TSV 50 as shown in FIG.

10 is formed. Next, as also shown in FIG. 10, the overlying front-side structures including etch stop layer 60, M0 vias 62, and metal lines 64 are formed. Some of M0 vias 62 and metal lines 64 are formed over, and in contact with, TSV 50. A backside grinding is then performed to expose TSV 50 from the backside of substrate 20, followed by the formation of redistribution line/pad 70 and electrical connector 72.

Figure 12:
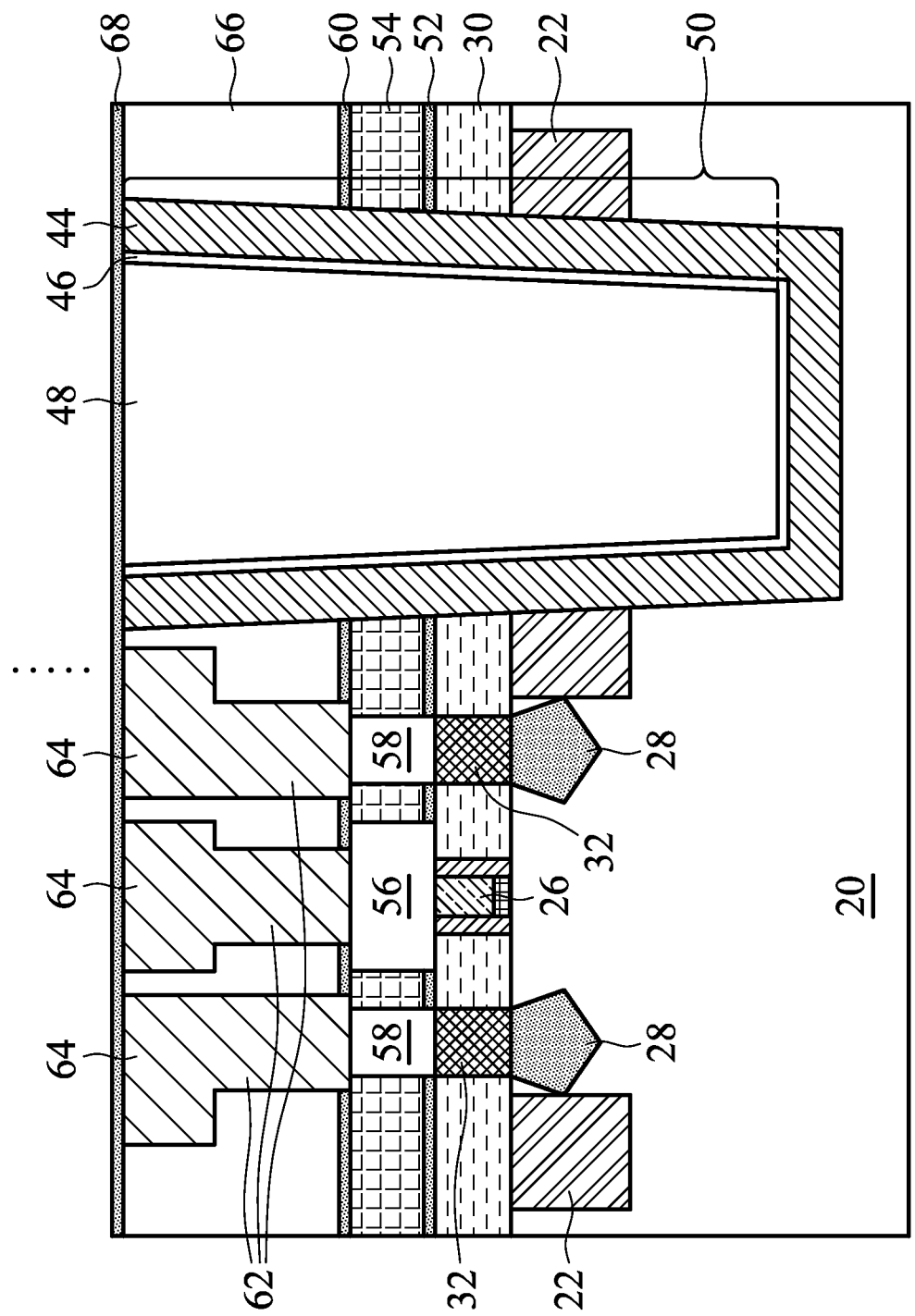
FIGS. 12 and 13 illustrate cross-sectional view of intermediate stages in the manufacturing of a TSV and a MOS device in accordance with yet alternative embodiments.
Figure 12A:
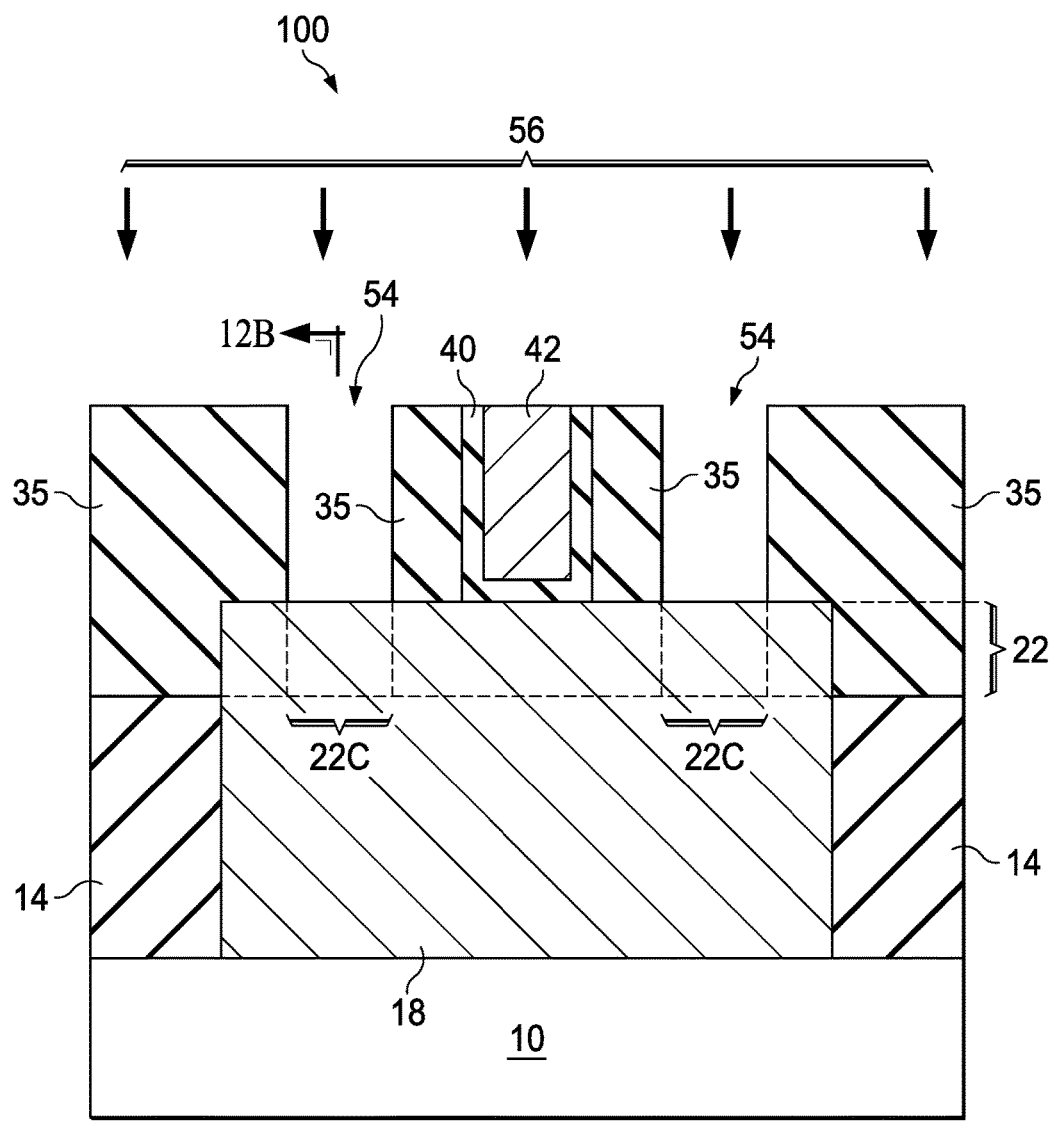
Figure 13:
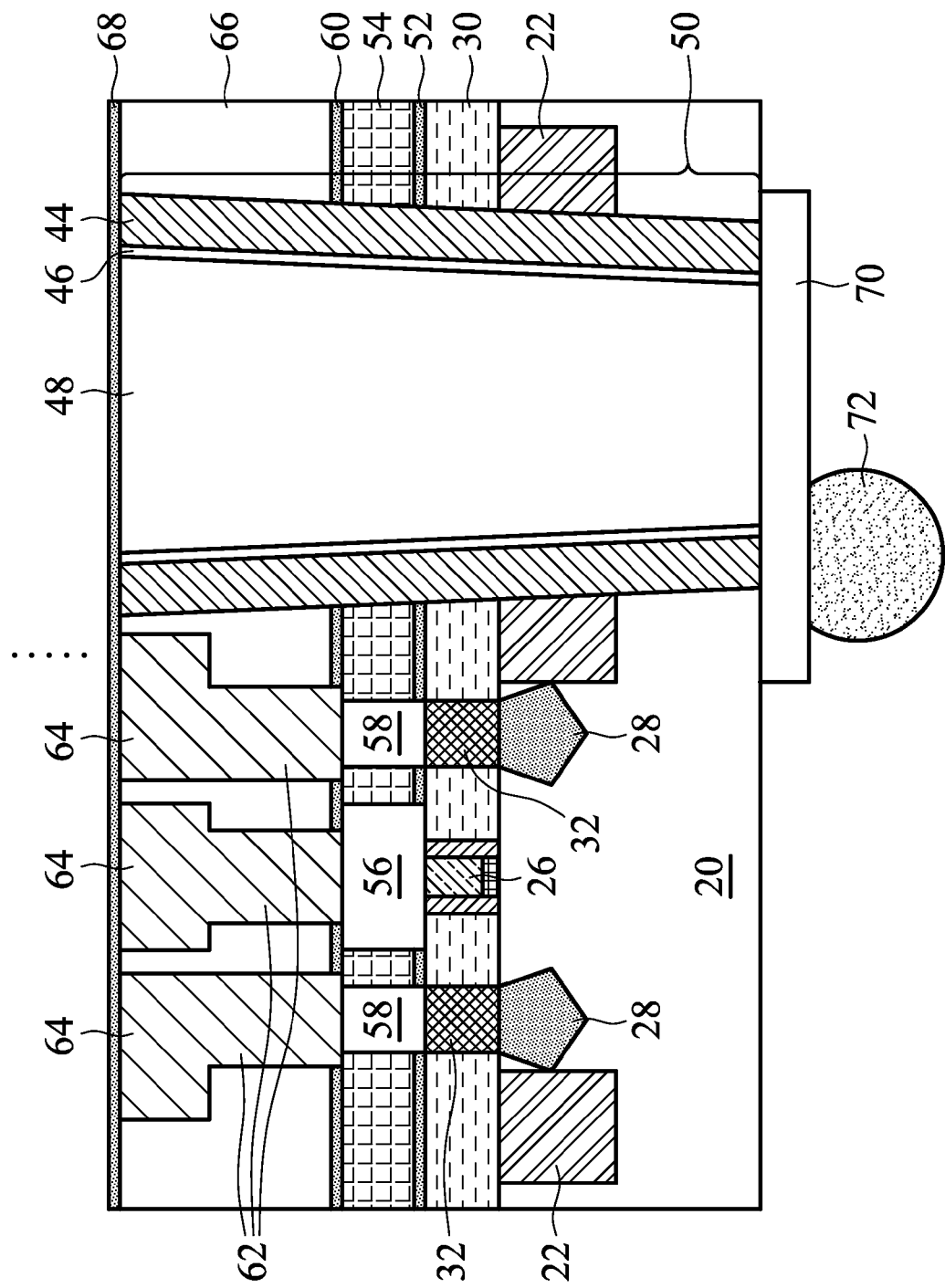

FIGS. 12 and 13 illustrate the cross-sectional view of intermediate stages in the formation of TSV 50 in accordance with yet alternative embodiments. In these embodiments, TSV 50 is formed after the formation of metal lines 64, using essentially the same method as in FIGS. 2 through 5. Etch stop layer 68 is then formed. Accordingly, the top surface of TSV 50 is level with the top surfaces of metal lines 64, which may form dual damascene structures with the underlying via0 62. More metal lines, vias, and dielectric layers similar to metal lines 64, vias 62, and dielectric layer 66, respectively, may be formed over the structure shown in FIGS. 12 and 13.

In accordance with embodiments, a device includes a semiconductor substrate and a MOS transistor. The MOS transistor includes a gate electrode over the semiconductor substrate, and a source/drain region on a side of the gate electrode. A source/drain contact plug includes a lower portion and an upper portion over the lower portion, wherein the source/drain contact plug is disposed over and electrically connected to the source/drain region. A gate contact plug is disposed over and electrically connected to the gate electrode, wherein a top surface of the gate contact plug is level with a top surface of the top portion of the source/drain contact plug. A TSV extends into the semiconductor substrate. A top surface of the TSV is substantially level with an interface between the gate contact plug and the gate electrode.

In accordance with other embodiments, a device includes a semiconductor substrate and a MOS transistor. The MOS transistor includes a gate electrode over the semiconductor substrate, and a source/drain region on a side of the gate electrode. A source/drain contact plug includes a lower portion and an upper portion over the lower portion, wherein the source/drain contact plug is over and electrically connected to the source/drain region. A gate contact plug is disposed over, and electrically connected to, the gate electrode, wherein a top surface of the gate contact plug is level with a top surface of the top portion of the source/drain contact plug. A TSV extends into the semiconductor substrate, wherein a top surface of the TSV is substantially level with a top surface of the source/drain contact plug. An etch stop layer is disposed over and contacting the TSV. The device further includes a via and a metal line over the via, wherein the via and the metal line form a dual damascene structure. A bottom surface of the via is in contact with a top surface of the gate contact plug. The via extends into the etch stop layer.

In accordance with yet other embodiments, a device includes a semiconductor substrate and a MOS transistor. The MOS transistor includes a gate electrode over the semiconductor substrate, and a source/drain region on a side of the gate electrode. A source/drain contact plug includes a lower portion and an upper portion over the lower portion, wherein the source/drain contact plug is over and electrically connected to the source/drain region. A gate contact plug is disposed over and electrically connected to the gate electrode, wherein a top surface of the gate contact plug is level with a top surface of the top portion of the source/drain contact plug. The device further includes a via and a metal line over the via, wherein the via and the metal line form a dual damascene structure. A bottom surface of the via is in contact with a top surface of the gate contact plug. A TSV extends into the semiconductor substrate, wherein a top surface of the TSV is substantially level with a top surface of the metal line.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate;
    a Metal-Oxide-Semiconductor (MOS) transistor comprising:
        a gate electrode over the semiconductor substrate; and
        a source/drain region on a side of the gate electrode;
    a source/drain contact plug comprising a lower portion and an upper portion over the lower portion, wherein the source/drain contact plug is over and electrically connected to the source/drain region;
    a gate contact plug over and electrically connected to the gate electrode, wherein a top surface of the gate contact plug is level with a top surface of the upper portion of the source/drain contact plug, and the gate contact plug comprises a continuous sidewall extending from a top surface of the gate electrode to a level coplanar with the top surface of the upper portion of the source/drain contact plug;
    a first via and a first metal line over the first via, wherein the first via and the first metal line form a first dual damascene structure, and a bottom surface of the first via is in contact with a top surface of the gate contact plug; and
    a Through-Substrate Via (TSV) extending into the semiconductor substrate, wherein a top surface of the TSV is substantially level with a top surface of the first metal line.

2. The device of claim 1 further comprising:
    an Inter-Layer Dielectric (ILD) over the semiconductor substrate, wherein the gate electrode and the lower portion of the source/drain contact plug comprise portions in the ILD; and
    an etch stop layer over and contacting the ILD, wherein the upper portion and the lower portion of the source/drain contact plug have an interface substantially level with a bottom surface of the etch stop layer.

3. The device of claim 2, wherein the upper portion of the source/drain contact plug extends through the etch stop layer.

4. The device of claim 1, wherein in a cross-sectional view of the device, the first via is laterally narrower than the first metal line.

5. The device of claim 1, wherein the TSV comprises:
an insulation layer in contact with the semiconductor substrate;
a diffusion barrier layer over the insulation layer; and
a metallic material over the diffusion barrier layer, wherein each of the insulation layer, the diffusion barrier layer, and the metallic material extends from the top surface of the first metal line into the semiconductor substrate.

6. The device of claim 1 further comprising an etch stop layer over the gate contact plug and the source/drain contact plug, wherein a bottom surface of the etch stop layer is in physical contact with top surfaces of both the gate contact plug and the source/drain contact plug.

7. The device of claim 1 further comprising a second via and a second metal line over the second via, wherein the second via and the second metal line form a second dual damascene structure, and a bottom surface of the second via is in contact with a top surface of the source/drain contact plug.

8. The device of claim 1 further comprising a Shallow Trench Isolation (STI) region, with substantially an entirety of the STI region in the semiconductor substrate, wherein the TSV penetrates through the STI region.

9. A device comprising:
a semiconductor substrate;
a Metal-Oxide-Semiconductor (MOS) transistor comprising:
a gate electrode over the semiconductor substrate; and
a source/drain region with a portion in the semiconductor substrate;
a first Inter-Layer Dielectric (ILD) over the source/drain region, wherein the first ILD has a top surface coplanar with a top surface of the gate electrode;
an etch stop layer over and contacting the first ILD;
a second ILD over and contacting the etch stop layer;
a gate contact plug having a bottom surface contacting a top surface of the gate electrode, and a top surface coplanar with a top surface of the second ILD;
a via and a metal line over the via, wherein the via and the metal line form a dual damascene structure, and a bottom surface of the via physically contacts a top surface of the gate contact plug;
a Through-Substrate Via (TSV) extending into the semiconductor substrate, wherein a top surface of the TSV is substantially level with a top surface of the metal line; and
a Shallow Trench Isolation (STI) region in the semiconductor substrate, with a top surface of the STI region coplanar with a top surface of the semiconductor substrate, and wherein the TSV penetrates through the STI region.

10. The device of claim 9, wherein the dual damascene structure comprises a diffusion barrier layer continuously extending from a top surface of the metal line to a bottom surface of the via.

11. The device of claim 9, wherein the gate contact plug laterally extend beyond an edge of the gate electrode.

12. The device of claim 11 further comprising an additional etch stop layer comprising a bottom surface contacting the top surface of the gate contact plug.

13. The device of claim 11 further comprising a source/drain contact plug electrically connected to a source/drain region of the MOS transistor, wherein the source/drain contact plug comprises:
a lower portion in the first ILD; and
an upper portion in the second ILD and the etch stop layer, wherein the lower portion and the upper portion of the source/drain contact plug have a distinguishable interface.

14. The device of claim 13, wherein a bottom surface of the via is at substantially a same level as a top surface of the upper portion of the source/drain contact plug source/drain contact plug.

15. The device of claim 9, wherein the gate contact plug comprises a straight sidewall extending from the bottom surface to the top surface of the gate contact plug.

16. The device of claim 9, wherein in a cross-sectional view of the device, the via is laterally narrower than the metal line.

17. A device comprising:
a semiconductor substrate;
a Metal-Oxide-Semiconductor (MOS) transistor comprising:
a gate electrode over the semiconductor substrate; and
a source/drain region with a portion in the semiconductor substrate;
a first Inter-Layer Dielectric (ILD) over the semiconductor substrate;
an etch stop layer over and contacting the first ILD;
a second ILD over and contacting the etch stop layer;
a gate contact plug having a bottom surface contacting a top surface of the gate electrode, and a top surface coplanar with a top surface of the second ILD, wherein the gate contact plug laterally extends beyond an edge of the gate electrode;
a Shallow Trench Isolation (STI) region extending into the semiconductor substrate;
a via and a metal line over the second ILD, wherein the via and the metal line form a dual damascene structure, and a bottom surface of the via physically contacts a top surface of the gate contact plug; and
a Through-Substrate Via (TSV) extending penetrating through the STI region, wherein a top surface of the TSV is substantially level with a top surface of the metal line.

18. The device of claim 17, wherein the gate contact plug comprises a straight sidewall extending from a first level to a second level, with the first level being coplanar with the top surface of the gate contact plug, and the second level being coplanar with the top surface of the second ILD.

19. The device of claim 17, wherein a bottom surface of the via is coplanar with a top surface of the second ILD.

20. The device of claim 17, wherein in a cross-sectional view of the device, the via is laterally narrower than the metal line.

* * * * *